(12) United States Patent
Regul et al.

(10) Patent No.: US 7,250,336 B2
(45) Date of Patent: Jul. 31, 2007

(54) METHOD FOR FABRICATING A SHADOW MASK IN A TRENCH OF A MICROELECTRONIC OR MICROMECHANICAL STRUCTURE

(75) Inventors: Jörn Regul, Dresden (DE); Dietmar Temmler, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/154,943

(22) Filed: Jun. 17, 2005

(65) Prior Publication Data

US 2006/0003560 A1    Jan. 5, 2006

(30) Foreign Application Priority Data

Jun. 18, 2004    (DE) ...................... 10 2004 029 516

(51) Int. Cl.
    *H01L 21/8242* (2006.01)
(52) U.S. Cl. ...................... 438/243; 438/386; 438/700; 438/944; 257/E27.091; 257/E21.651; 257/E27.092; 257/E29.346
(58) Field of Classification Search ................ 438/243, 438/246, 386, 389, 700, 944, FOR. 220, 438/FOR. 430; 257/E27.091, E21.651, E27.092, 257/E29.346
See application file for complete search history.

(56) References Cited

U.S. PATENT DOCUMENTS

| 2002/0090824 | A1 | 7/2002 | Jaiprakash et al. |
| 2003/0003652 | A1* | 1/2003 | Gobel et al. ................ 438/243 |
| 2005/0009268 | A1* | 1/2005 | Cheng et al. ................ 438/249 |
| 2005/0277264 | A1* | 12/2005 | Cheng et al. ................ 438/433 |

* cited by examiner

*Primary Examiner*—Michelle Estrada
(74) *Attorney, Agent, or Firm*—Eschweiler & Associates, LLC

(57) ABSTRACT

The present invention provides a method for fabricating a shadow mask in a trench of a microelectronic or micromechanical structure, comprising the steps of: providing a trench in the microelectronic or micromechanical structure; providing a partial filling in the trench; providing a first liner mask layer on the partial filling; providing a sacrificial filling on the liner mask layer to completely fill the trench; shallow etching back of the sacrificial filling into the trench; forming a first mask on the top side of the sacrificial filling in the trench; removing a subregion of the sacrificial filling in the trench using the first mask; and optionally removing a subregion of the first liner mask layer below it on the partial filling, the remaining subregion of the sacrificial filling in the trench serving as a second mask.

9 Claims, 20 Drawing Sheets

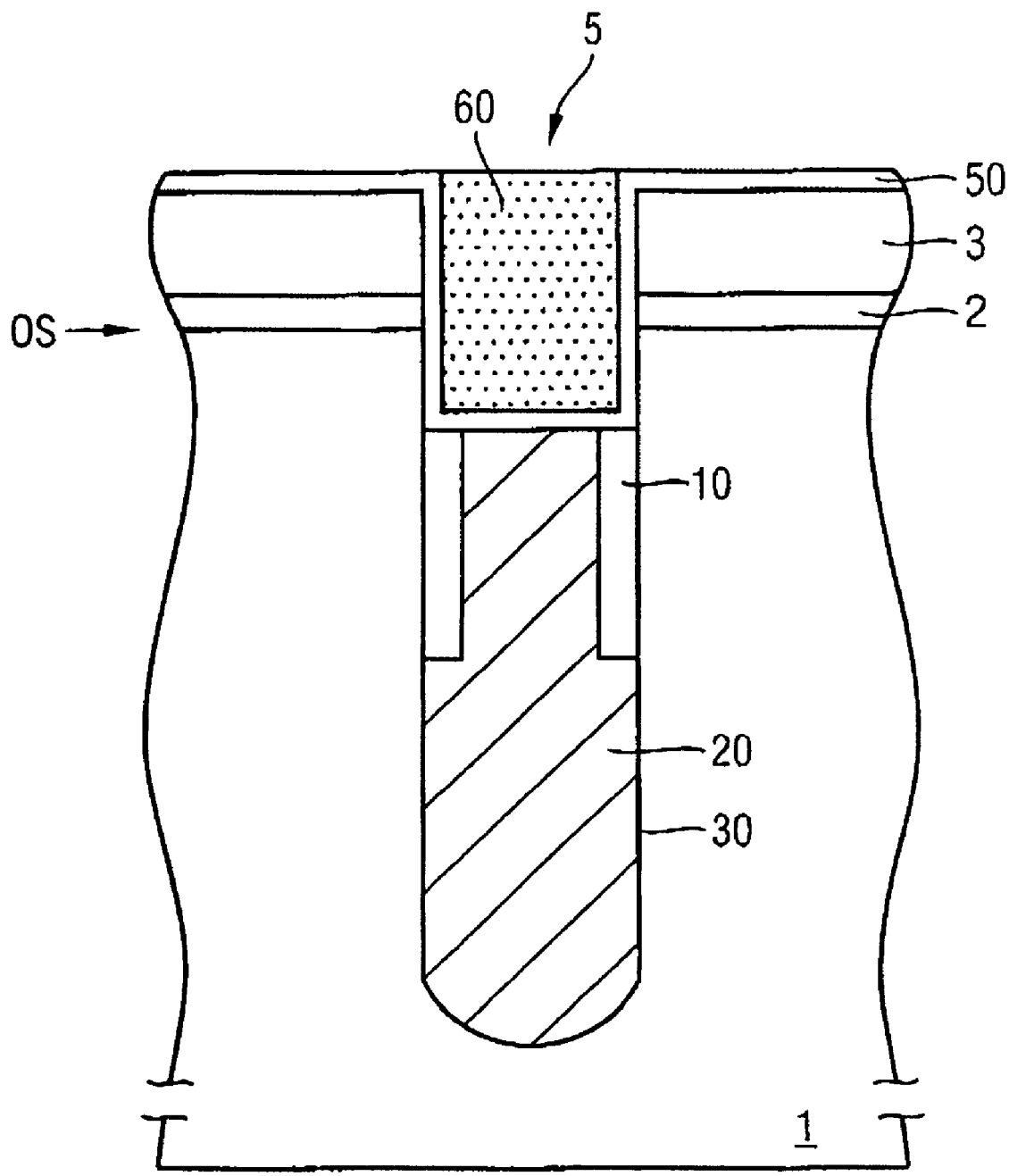

METHOD FOR FABRICATING A SHADOW MASK IN A TRENCH OF A MICROELECTRONIC OR MICROMECHANICAL STRUCTURE

CLAIM FOR PRIORITY

This application claims priority to German Application No. 10 2004 029 516.6 filed Jun. 18, 2004, which is incorporated herein, in its entirety, by reference.

TECHNICAL FIELD OF THE INVENTION

The present invention relates to a method for fabricating a shadow mask in a trench of a microelectronic or micromechanical structure.

BACKGROUND OF THE INVENTION

Special structures of microelectronic or micromechanical components often require that sublithographic structure elements be formed asymmetrically with respect to existing reference structures, for example on only one side of the reference structure, precisely aligned with the reference structure during the fabrication process.

The situation in which a sublithographic structure element of this type has to be arranged in the base region of a trench with a high aspect ratio (ratio of depth to width) is a particular problem. A structure element of this type can only be realized with very considerable restrictions using standard photolithographic patterning, but the other patterning methods which have hitherto been used for this purpose are reaching their limits in a number of respects when scaled to <90 nm.

Various solutions to the abovementioned problem are known, depending on the absolute feature size and the required accuracy of alignment between reference structure and structure element that is to be formed.

One possible option consists in accurate aligning of a lithographic mask relative to the reference structure and subsequent conventional patterning. The main problems of the method are the need to maintain the required accuracy of alignment between the underlying structure and the mask structure (with current exposure methods used in mass production, $\geq 30\%$ of the minimum feature size) and the free exposure/developing of the regions which are not to be masked, in particular in the case of trench or relief structures with a high aspect ratio.

A further option is offered by what are known as shadow mask methods, which make use of a shadow effect of the reference relief.

In a first type, shadow mask coating of the relief is effected predominantly by vacuum vapor deposition of semiconductor or metallic materials from a directed areal, linear or punctiform source with the substrate in a stationary position. In this case, the mask layer is deposited substantially only in the unshadowed regions of the reference relief. The main problems of the method are the limited choice of materials, the availability of stable sources/installations and the need to maintain the required process conditions, such as for example a low residual gas pressure, a low substrate temperature, etc.

A second type provides for oblique implantation of ions, for example B or $BF_2$, into a thin amorphous or fine-crystalline silicon layer that has been deposited on the reference relief, after which the unimplanted layer regions located in the shadow regions of the relief structure are removed by an isotropic selective silicon etching process. As a result, the mask layer remains in place in asymmetric form only in the irradiated regions of the reference relief. The thin silicon mask layer which remains is then optionally also converted into $SiO_2$ by oxidation. The main problems of this type of process are the need to achieve the local implantation dose required for the selectivity of the silicon etch (approximately $10^{19}$ cm$^{-3}$) in those regions of the three-dimensional structure of the reference relief which are to be masked, the restrictions imposed on the thickness of the amorphous silicon layer by the trench width of the reference relief, and the risk of parasitic doping of active silicon regions during the mask patterning.

A further type provides for oblique implantation of ions into a thin amorphous insulator layer deposited on the reference relief, and subsequent removal of the implanted layer regions by an isotropic selective etching process. As a result, the mask layer remains in asymmetric form only in the shadow regions of the reference relief.

The main problems of the method are the need to achieve the implantation dose required for the selectivity of the insulator etch ($>10^{19}$ cm$^{-3}$) in those regions of the three-dimensional structure of the reference relief which are to be removed, the relatively low selectivity which can be achieved with respect to implanted/unimplanted layer regions, the restrictions imposed on the thickness of the insulator layer by the trench width of the reference relief, and the risk of parasitic doping of active silicon areas during the mask patterning.

A fourth type provides for direct patterning with a thin, amorphous carbon mask layer deposited on the reference structure by oblique implantation of oxygen species (O, $O_2$, $O_3$).

As a result, the C mask layer remains in asymmetric form only in the shadow regions of the reference relief. This C mask layer structure is then transferred into further layers or into the substrate by means of conventional etching processes.

The main problems of this type are the availability of oxygen sources/installations with a sufficient jet intensity and a high productivity, making the C coating sufficiently conformal on the reference relief and the restrictions imposed on the C layer thickness by the trench width of the reference relief.

SUMMARY OF THE INVENTION

The present invention provides an improved method for fabricating a shadow mask in a trench of a microelectronic or micromechanical structure.

One embodiment of the present invention resides in the use of a special shadow mask process which is distinguished by a sacrificial filling, which is etched back to a very shallow depth, in the recesses of the reference relief, this sacrificial filling preferably being transformed, by means of oblique implantation and selective etching, into an asymmetric mask layer which is self-aligned with respect to the reference relief, preferably above an active semiconductor surface, and is converted to a liner mask layer in the depth of the reference relief over the course of further steps.

One solution according to the invention provides improved scalability. The trench width of the reference relief has no influence on the mask structure. The sacrificial filling which has been etched back to a shallow and planar depth in the trench of the reference relief forms a geometry with a low aspect ratio, which is extremely advantageous for oblique implantation. This minimizes implantation scatter effects and results in a steep lateral dose gradient between the implanted region and the shadowed region. As a result of the exclusively horizontal oblique implantation mask surface, there is no mask layer with its own shadowing effect above the latter at the relief walls. As a result, the local implantation dose which is required for the selectivity of the subsequent etch ($10^{19}$ cm$^{-3}$ for amorphous silicon) is reached all the way to or beyond the edge of the implanted mask surface.

Furthermore, the invention offers an unrestricted mask thickness. The filling depth of the sacrificial filling which has been etched back to a shallow depth in the trench of the reference relief can be set within wide limits. This makes it possible to realize a sufficiently thick layer for the subsequent oblique implantation and the subsequent selective etch. As a result, it is also possible to achieve a sufficiently thick resulting mask layer for the further transfer of the structure, without this having any detrimental effect on the scalability of the mask.

The invention makes it easy to transfer the mask structure to the relief base region. The near-surface production of a pattern by the mask (high pregnancy of the mask structure) combined with the realization of sufficiently thick masks enables the structure to be transferred into the depth or into the base region of the reference relief and corresponding patterning to be carried out there without any loss of quality by means of suitable etching processes, and without any limit being imposed on the scalability.

Furthermore, the invention makes it easy to avoid parasitic doping when employing oblique implantation. This is because the mask structure is produced near to the surface, preferably in the thickness region of the relief mask above the semiconductor surface, preferably arranged on the reference relief. As a result, the oblique implantation, in terms of dose and energy, can be focused solely with a view to achieving an optimum mask structure, without having to take account of the need to avoid parasitic doping.

According to a preferred embodiment, the remaining subregion of the sacrificial filling is removed after removal of the subregion of the first liner mask layer.

According to a further preferred embodiment, the first mask is formed by:

providing a second liner mask layer on the top side of the sacrificial filling in the trench;

carrying out an oblique implantation in order to modify the etching rate of a subregion of the second liner mask layer at the top side of the sacrificial filling in the trench for a predetermined etching process; and selectively removing the subregion or the complementary subregion of the second liner mask layer at the top side of the sacrificial filling in the predetermined etching process.

According to a further preferred embodiment, the first mask is formed by:

carrying out an oblique implantation in order to modify the etching rate of a subregion at the top side of the sacrificial filling in the trench for a predetermined etching process;

selectively recessing the subregion or the complementary subregion at the top side of the sacrificial filling in the predetermined etching process;

filling the selectively recessed subregion or complementary subregion with at least a third liner mask layer; and leveling the filled subregion or complementary subregion so as to be flush with the top side of the sacrificial filling.

According to a further preferred embodiment, the microelectronic or micromechanical structure has a semiconductor substrate and a third mask, which leaves the trench uncovered.

According to a further preferred embodiment, the shallow etchback of the sacrificial filling into the trench is carried out down to a depth above a top side of the semiconductor substrate.

According to a further preferred embodiment, a capacitor dielectric is provided in the lower and middle trench regions, an insulation collar is provided in the middle and upper trench regions, and an electrically conductive filling is provided as far as the top side of the insulation collar in the trench.

According to a further preferred embodiment, the sacrificial filling is produced from silicon.

According to a further preferred embodiment, the shallow etchback of the sacrificial filling into the trench is carried out down to a depth which approximately corresponds to the trench width.

BRIEF DESCRIPTION OF THE DRAWINGS

Exemplary embodiments of the invention are illustrated in the drawings and explained in more detail in the following description. In the drawings:

FIGS. 3A-G show successive method stages involved in a method for fabricating a shadow mask in a trench of a trench capacitor structure as a third embodiment of the present invention.

In the figures, identical reference designations denote identical or functionally equivalent components.

DETAILED DESCRIPTION OF THE INVENTION

Although they can be applied to any microelectronic or micromechanical structures, the present invention and the problem on which it is based are of particular relevance to integrated memory circuits in silicon technology. The following examples are therefore directed at a method for fabricating a trench capacitor with an insulation collar, which is electrically connected to a substrate on one side via a buried contact.

FIGS. 1A-G show successive method stages involved in a method for fabricating a shadow mask in a trench of a trench capacitor structure as a first embodiment of the present invention.

Figure 1A:
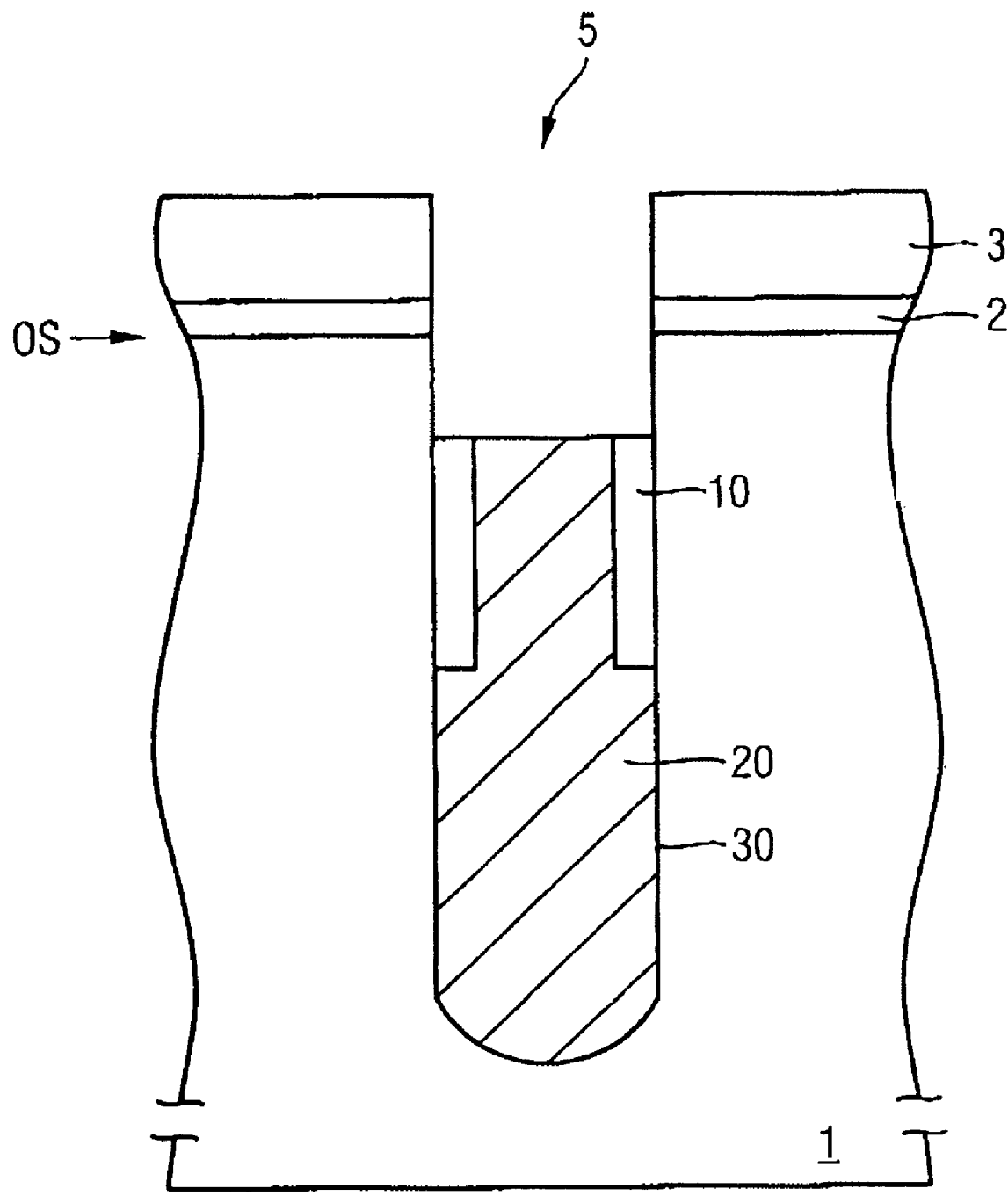
FIGS. 1A-G show successive method stages involved in a method for fabricating a shadow mask in a trench of a trench capacitor structure as a first embodiment of the present invention.

In FIG. 1A, reference numeral 1 denotes a silicon semiconductor substrate, in which active areas (not shown) are located near to the top side OS. The semiconductor substrate 1 is provided with a hard mask consisting of a pad oxide layer 2 and a pad nitride layer 3 above it.

In the trench 5, which has been formed in the semiconductor substrate 1 and at which the hard mask 2, 3 has been opened up, there is a capacitor dielectric 30, an insulation collar 10 in the upper region and also a conductive filling 20, preferably formed from polysilicon, as inner capacitor electrode. The outer capacitor electrode is formed by the surrounding doped semiconductor substrate 1. The polysilicon filling 20 has been etched back to below the top side OS of the semiconductor substrate 1, approximately as far as the level of the insulation collar 10.

Figure 1B:
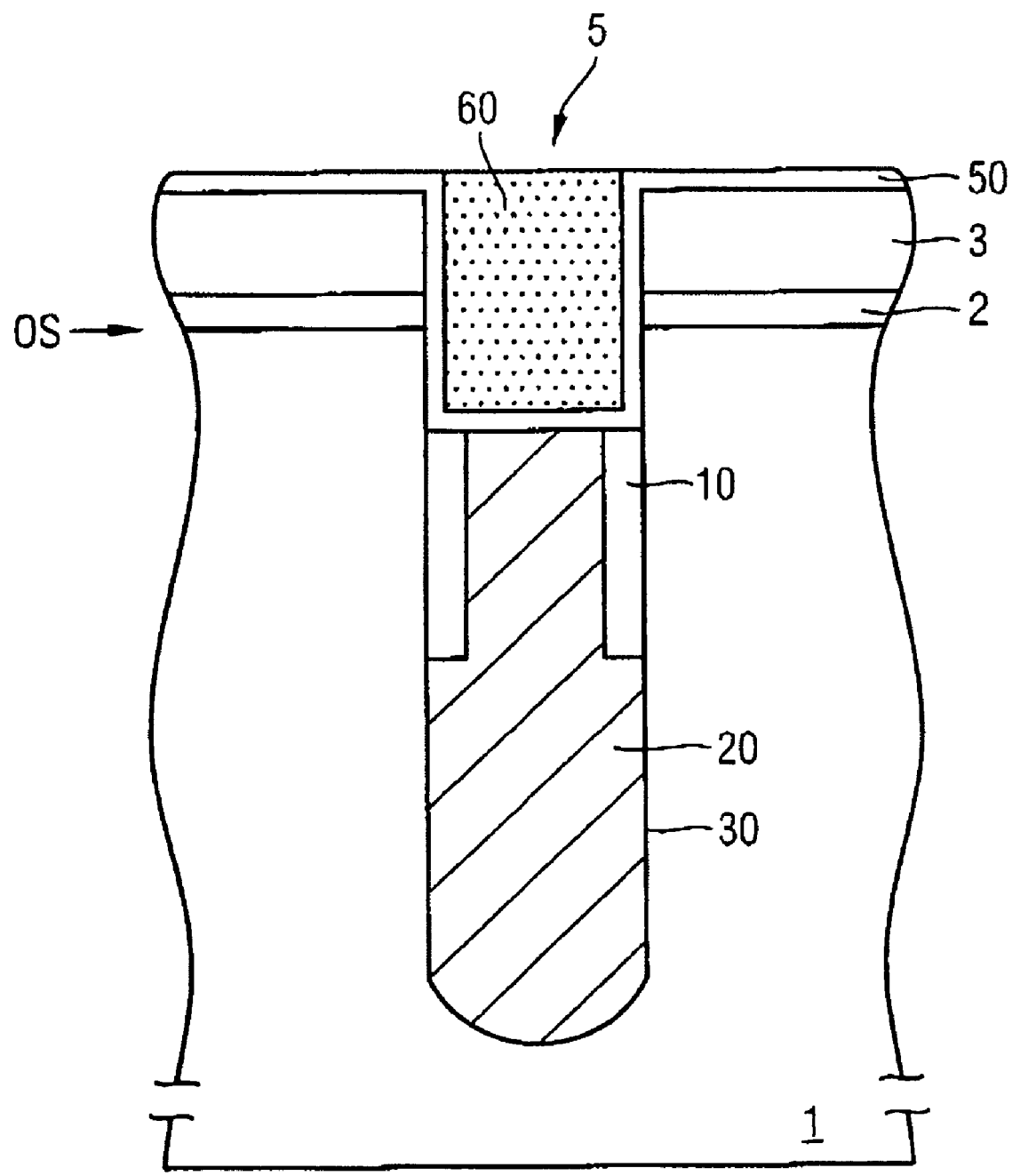

Referring now to FIG. 1B, a liner mask layer 50, preferably of silicon nitride, is provided over the resulting structure, and then the trench is filled with a sacrificial filling 60, preferably of amorphous silicon. This filling is expediently effected by depositing the sacrificial filling 60 and subsequently polishing it back, for example by means of a CMP process.

Figure 1C:
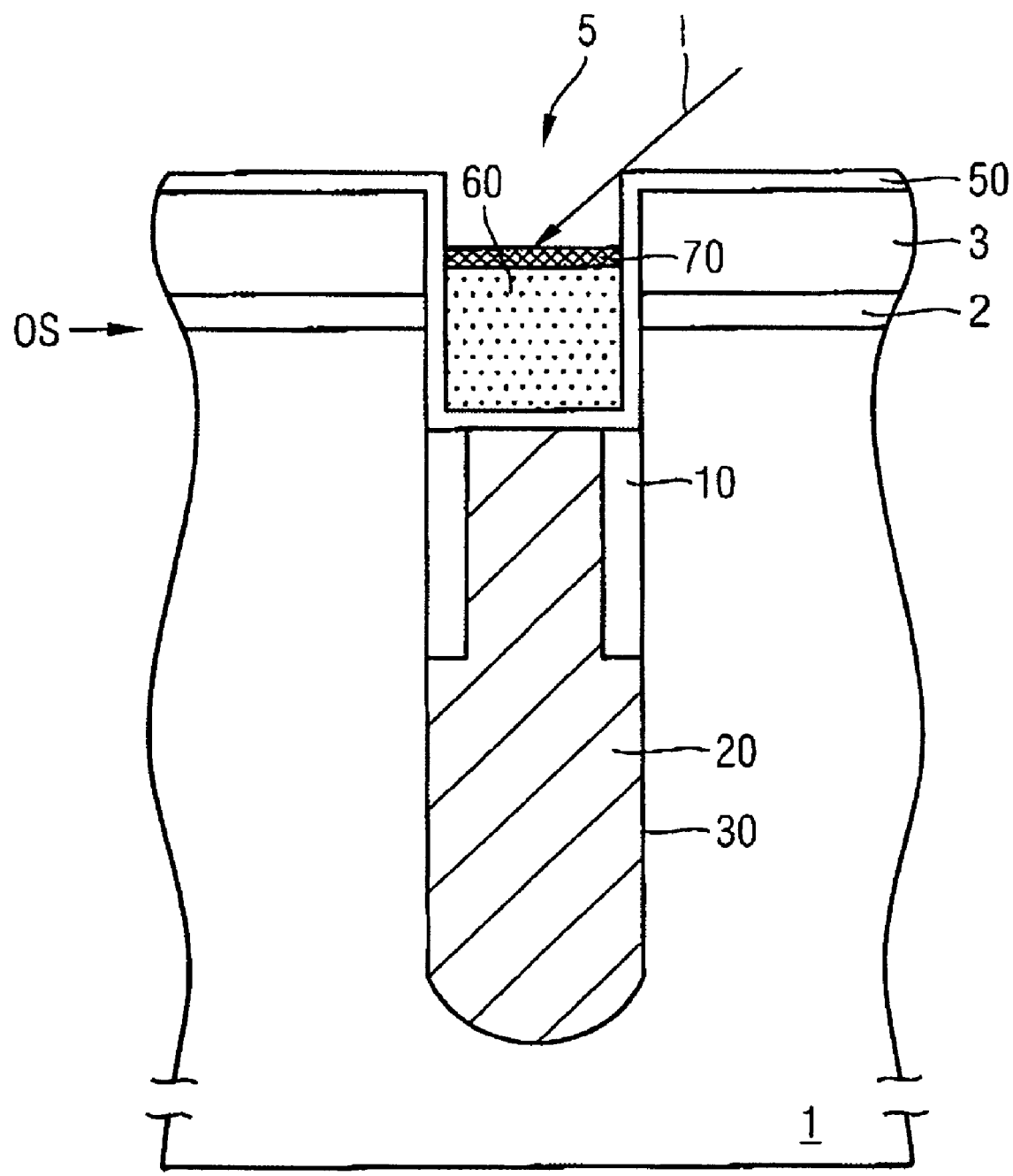

Continuing with reference to FIG. 1C, the sacrificial filling 60 is etched back by means of a shallow recess etch down to a depth of the order of magnitude of the trench width of the relief structure, with the surface of the filling 60 which has been etched back remaining above the top side OS of the semiconductor substrate 1. Then, a mask layer 70 of $SiO_2$ is formed on the etched-back surface of the sacrificial filling 60, specifically by a conversion/reaction process at the surface of the silicon. In addition to oxidation, nitriding, saliciding or the like could also be applied here, or alternatively layer deposition and etchback of a different mask material could be carried out.

This is followed by oblique ion implantation I with a parallel particle jet of charged ions with a low energy (typically <15 keV) at an angle which is typically inclined at an order of magnitude of 10° to 80° with respect to the normal to the semiconductor substrate 1. On account of the shadow effect of the hard mask of the relief structure, the ion implantation I impinges only on a subregion of the mask layer 70, in the present example the left-hand half, while the right-hand half remains shadowed.

Figure 1D:
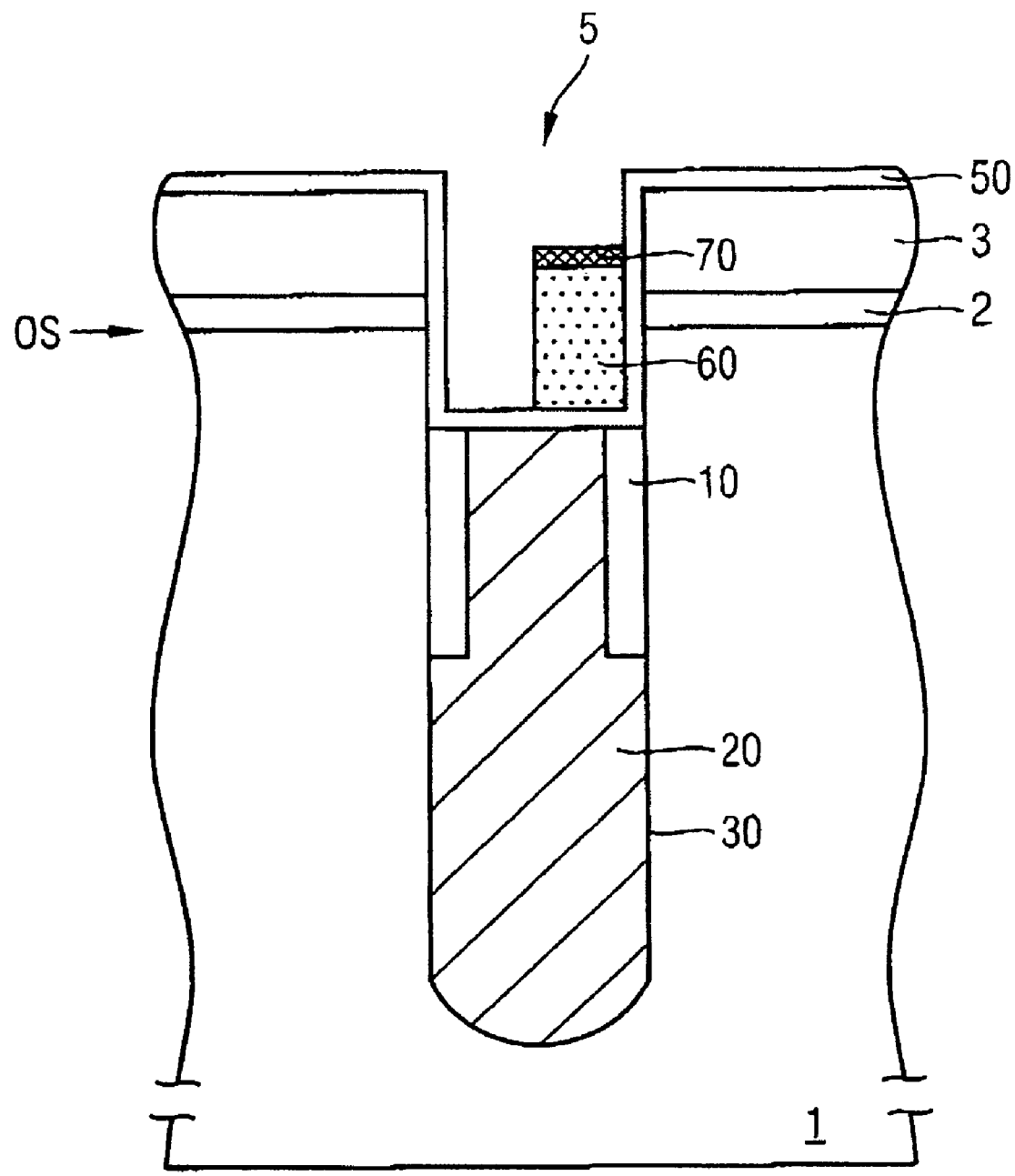

In a subsequent process step, which is illustrated in FIG. 1D, the implanted subregion of the mask layer 70 is then etched selectively, since its etching rate has been made significantly higher by the implantation than the etching rate of the unimplanted subregion. This etch is followed by a further anisotropic etch, preferably a plasma etch, which transfers the geometry of the mask layer 70 into the sacrificial filling 60 of amorphous silicon. This etch stops at the liner mask layer 50.

Figure 1E:
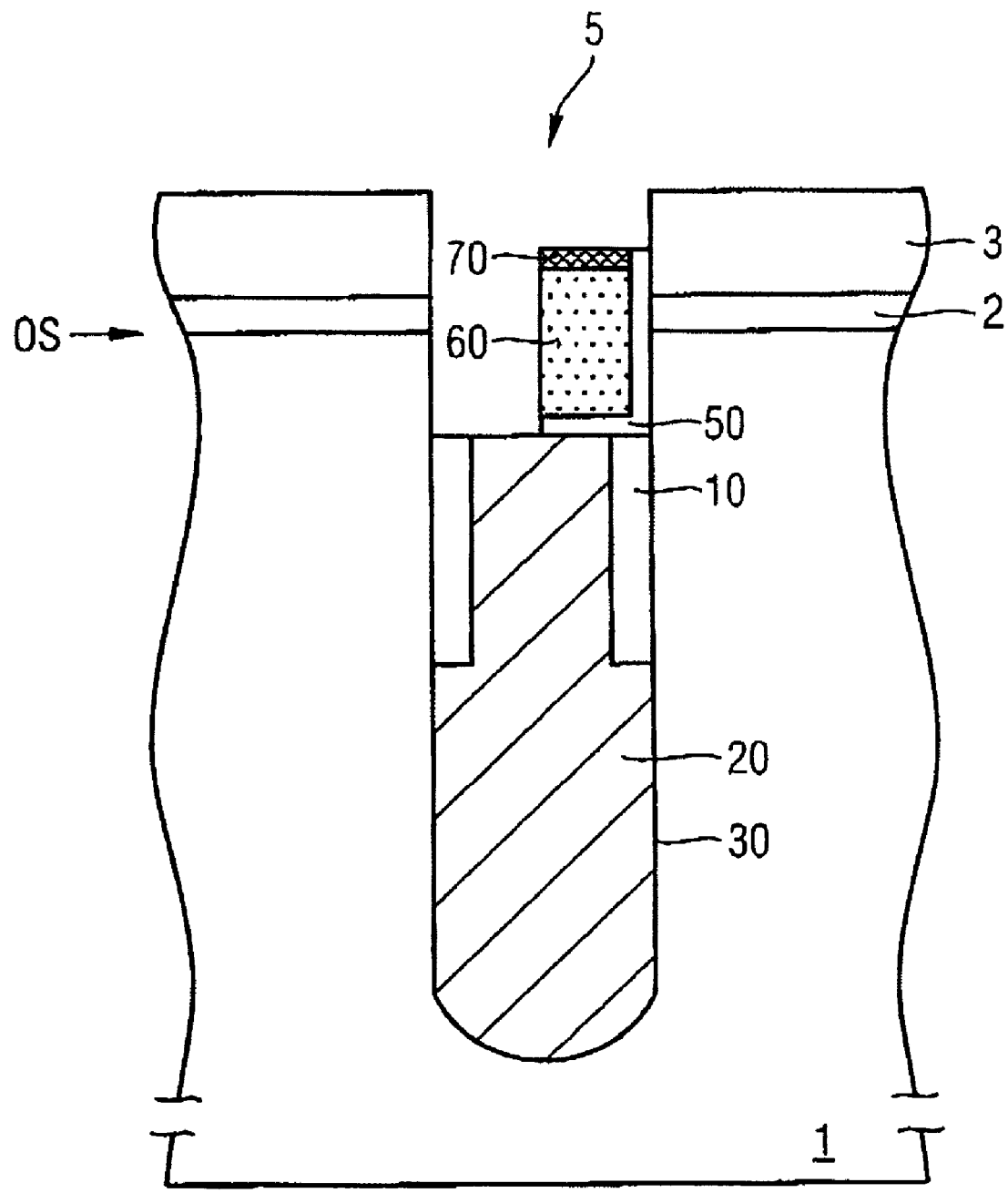

In a further step, which is illustrated in FIG. 1E, the uncovered part of the liner mask layer 50 is then removed, preferably by means of an isotropic etch.

Figure 1F:
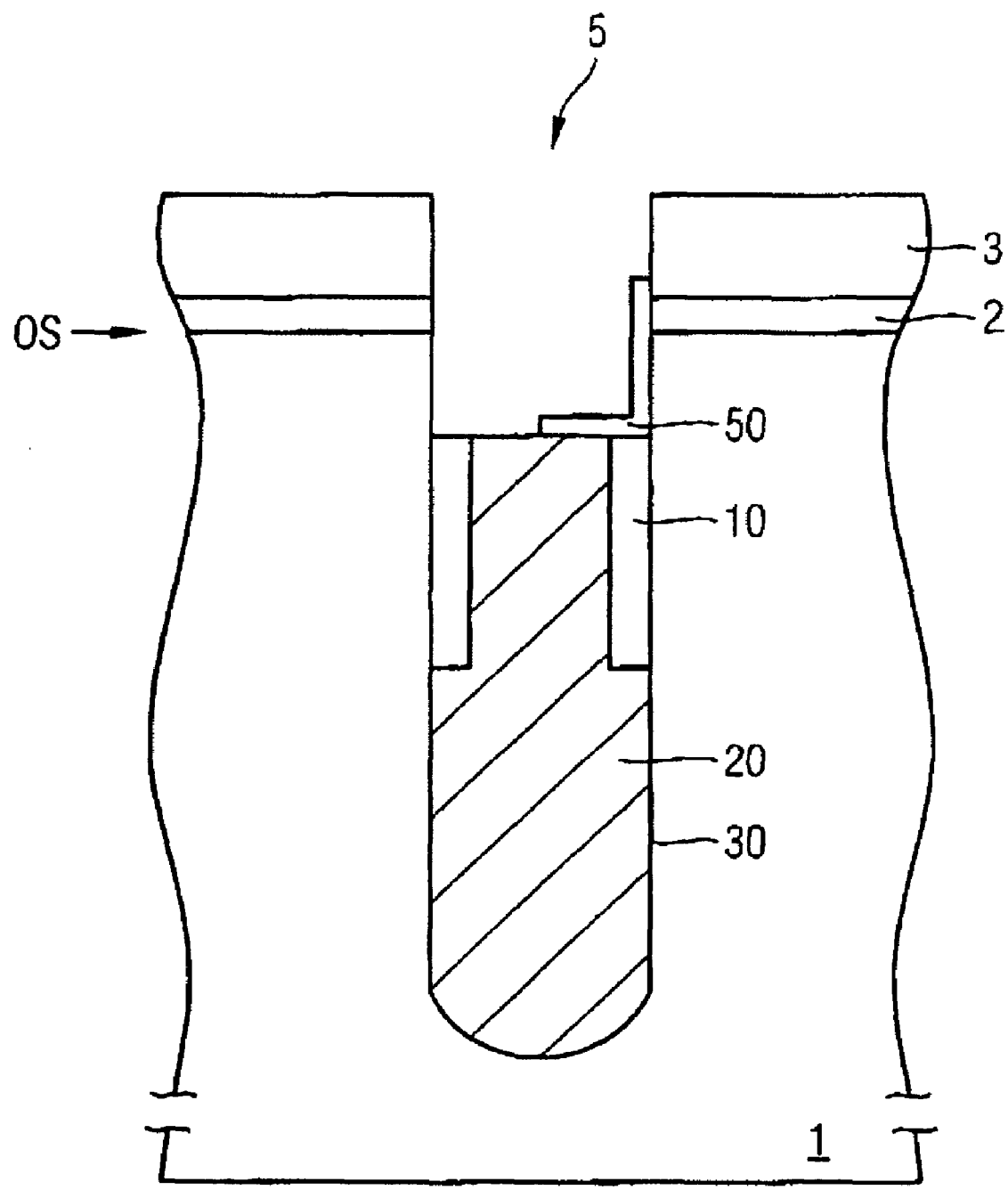

Continuing with reference to FIG. 1F, the remaining mask layer 70 of silicon oxide and the remaining sacrificial filling 60 of amorphous silicon can then be removed selectively, with the result that the liner mask layer 50 is available as a mask with left/right asymmetry for transferring further structures into the polysilicon filling 20. In other words, the structure of the top mask layer 70 has therefore been transferred to the liner mask layer 50.

Figure 1G:
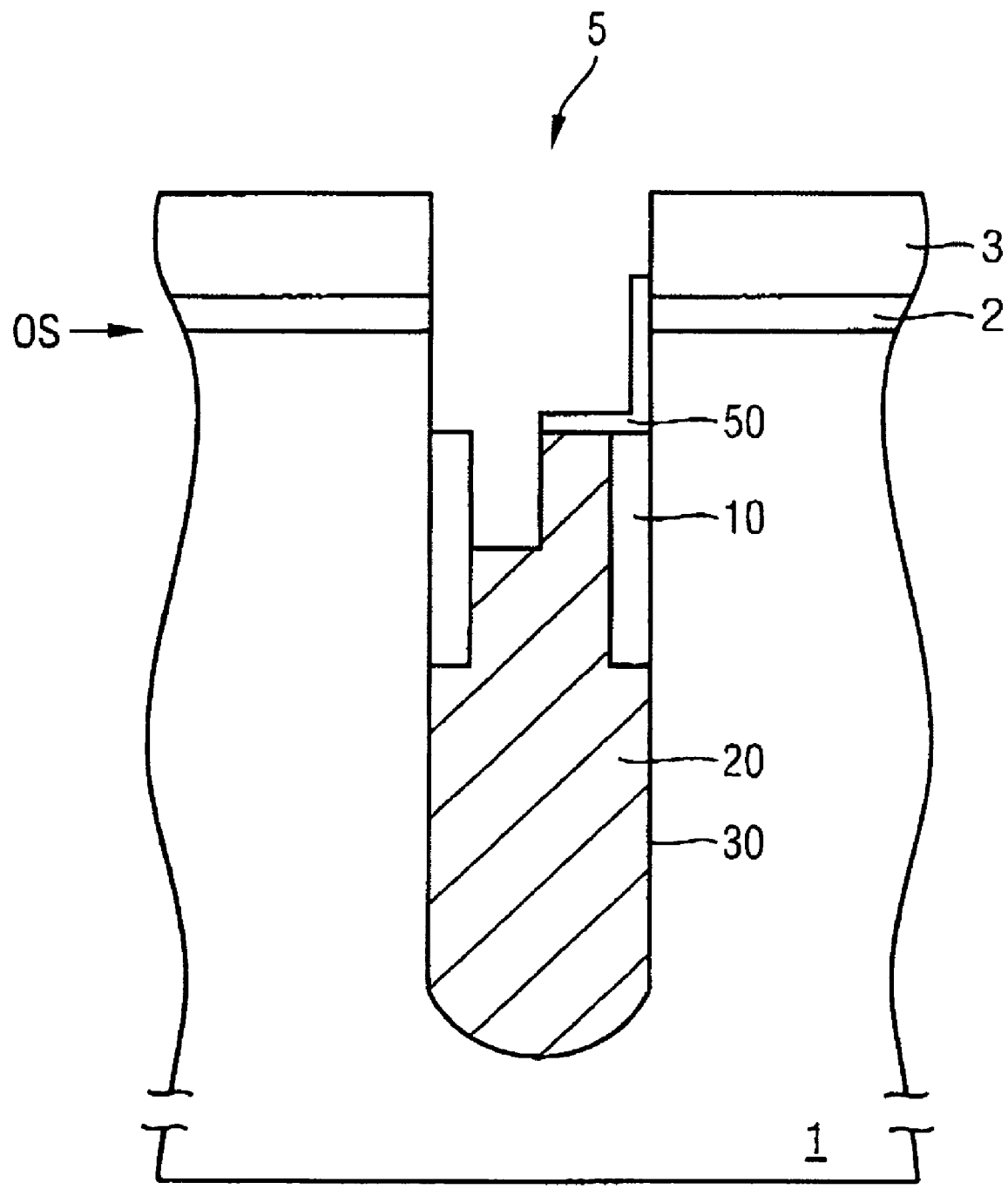

Referring now to FIG. 1G, in this example the further transfer of structures is carried out in such a manner that a subregion of the polysilicon filling 20 located above the insulation collar is removed using the liner mask layer 50 as a mask, in order subsequently for an insulation region for corresponding connection of the trench capacitor to the semiconductor substrate 1 on one side only to be created there.

Figure 2A:
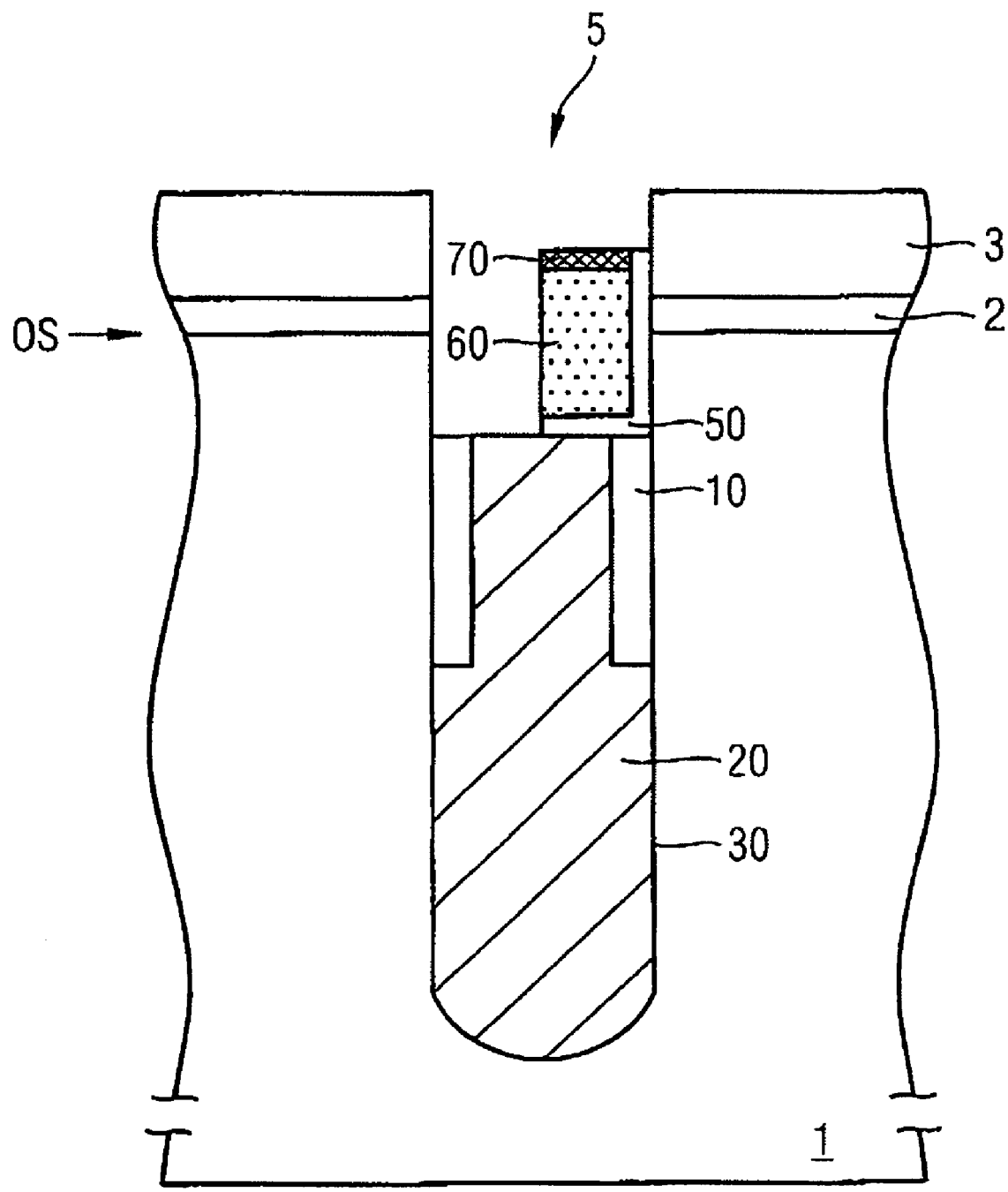
FIGS. 2A-C show successive method stages involved in a method for fabricating a shadow mask in a trench of a trench capacitor structure as a second embodiment of the present invention.
Figure 2B:
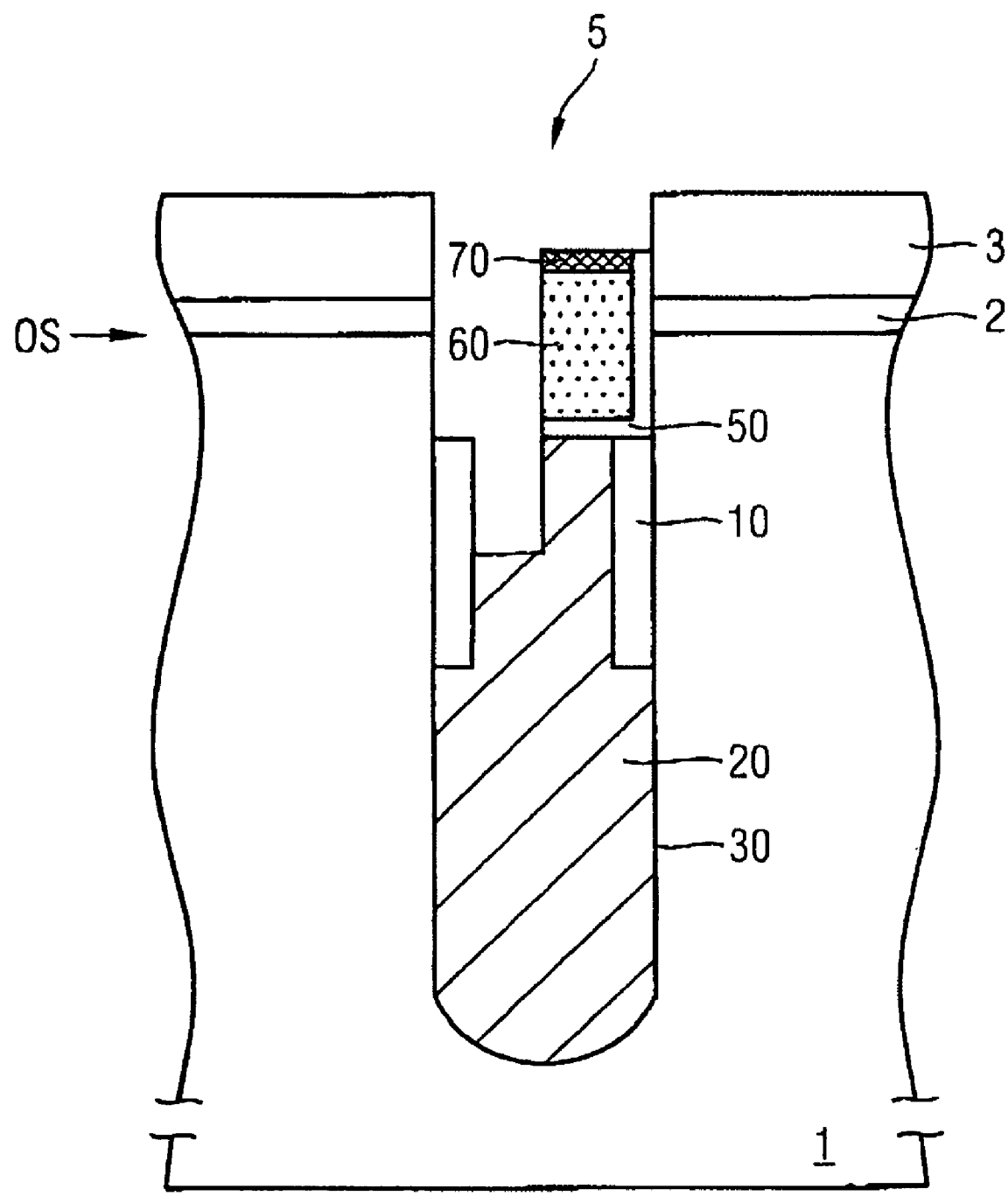
Figure 2C:
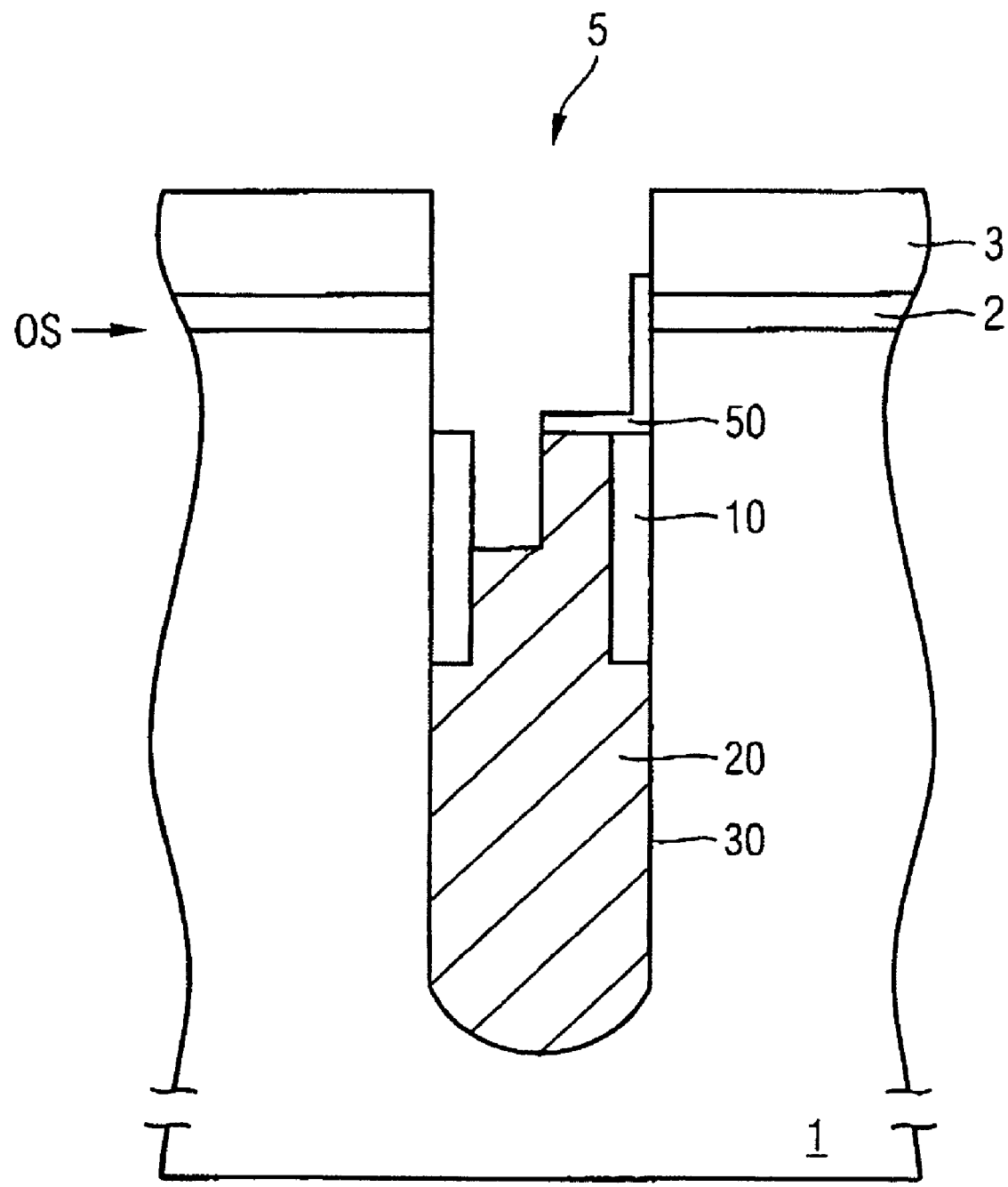

FIGS. 2A-C show successive method stages involved in a method for fabricating a shadow mask in a trench of a trench capacitor structure as a second embodiment of the present invention.

The second embodiment starts from the process state illustrated in FIG. 1E, which corresponds to the illustration presented in FIG. 2A.

In this second embodiment, the transfer of structures into the polysilicon filling 20 takes place prior to the removal of the remaining sacrificial filling 60 and upper mask layer 70, as illustrated in FIG. 2B.

Only afterwards, in accordance with FIG. 2C, are the upper mask layer 70 of silicon oxide and the remaining sacrificial filling 60 of amorphous silicon removed.

FIGS. 3A-H show successive method stages involved in a method for fabricating a shadow mask in a trench of a trench capacitor structure as a third embodiment of the present invention.

The third exemplary embodiment begins at the process state shown in FIG. 2B, which corresponds to the state shown in FIG. 3A.

Figure 3B:
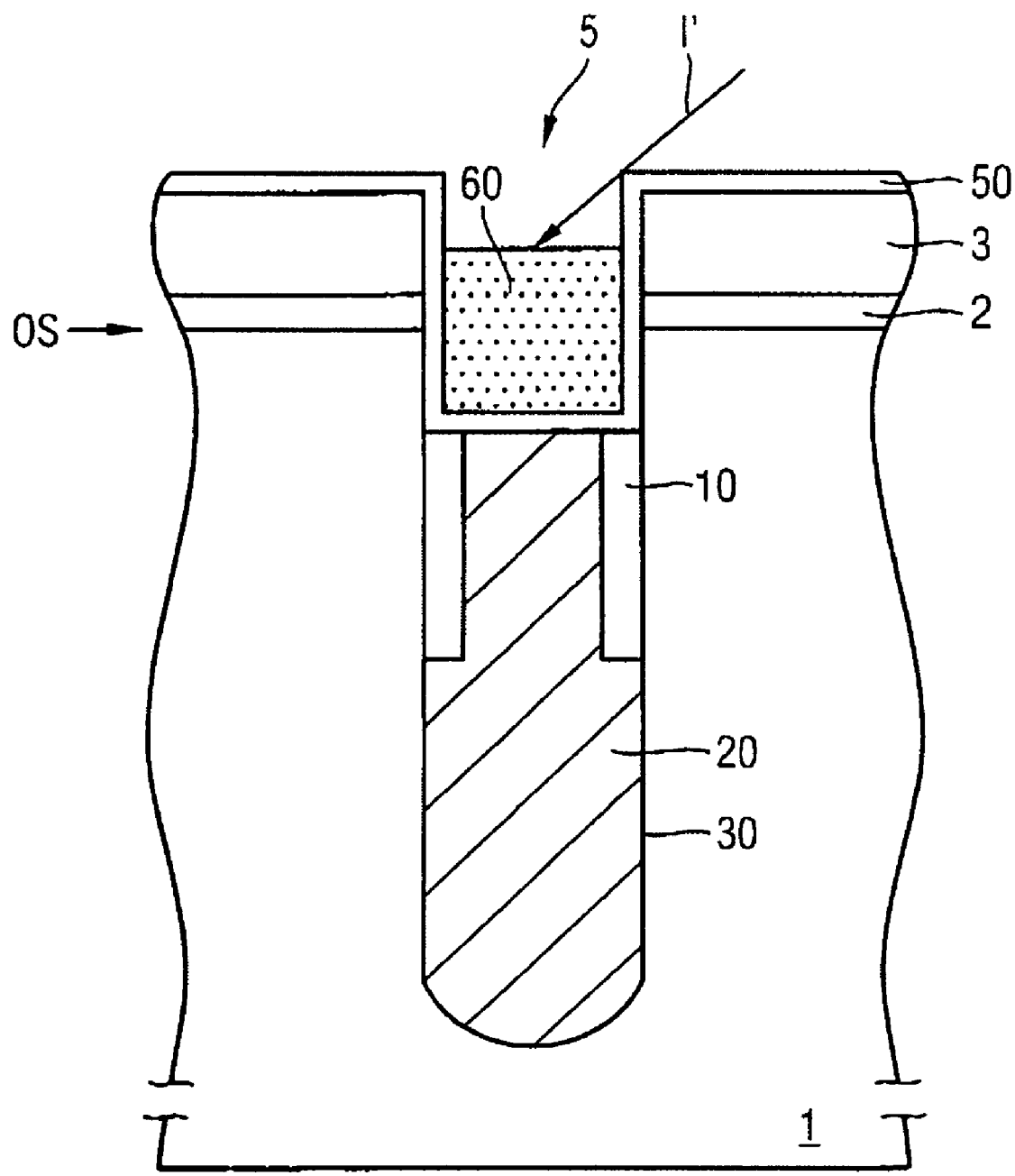

Continuing with reference to FIG. 3B, the shallow recess etch of the sacrificial filling 60 is then carried out, followed by an oblique implantation of B or $BF_2$ ions with a low energy (typically <15 keV) at an angle of 10° to 80° with respect to the normal to the semiconductor substrate 1.

Figure 3C:
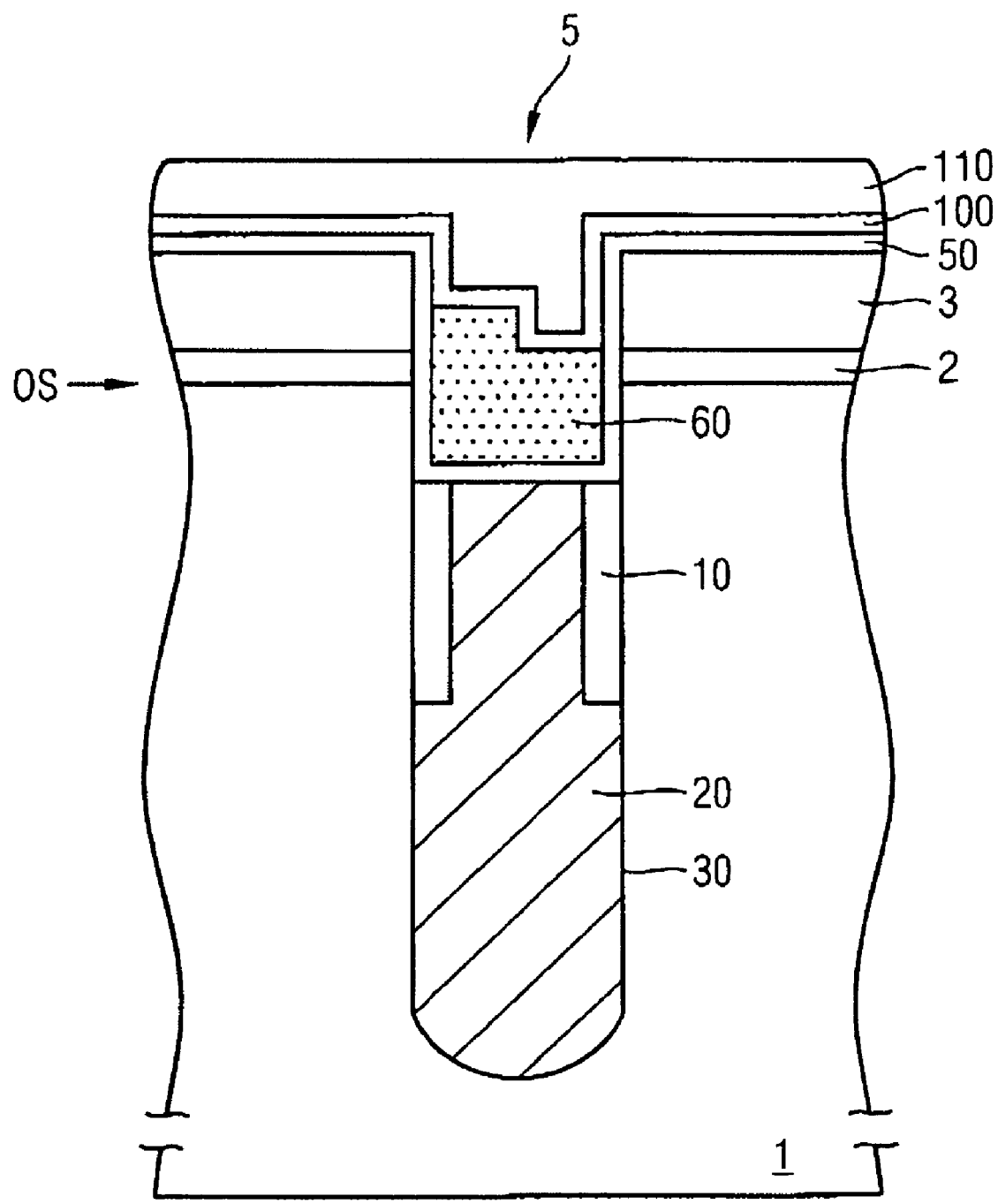

The ion implantation I' alters the properties of the sacrificial filling 60 in a surface region, which in accordance with FIG. 3C is utilized for a selective etch which forms a step in the sacrificial filling 60. Then, a liner mask layer 100, preferably of silicon nitride, and then an upper liner mask layer 110, preferably of silicon oxide, are optionally deposited over the resulting structure.

Figure 3D:
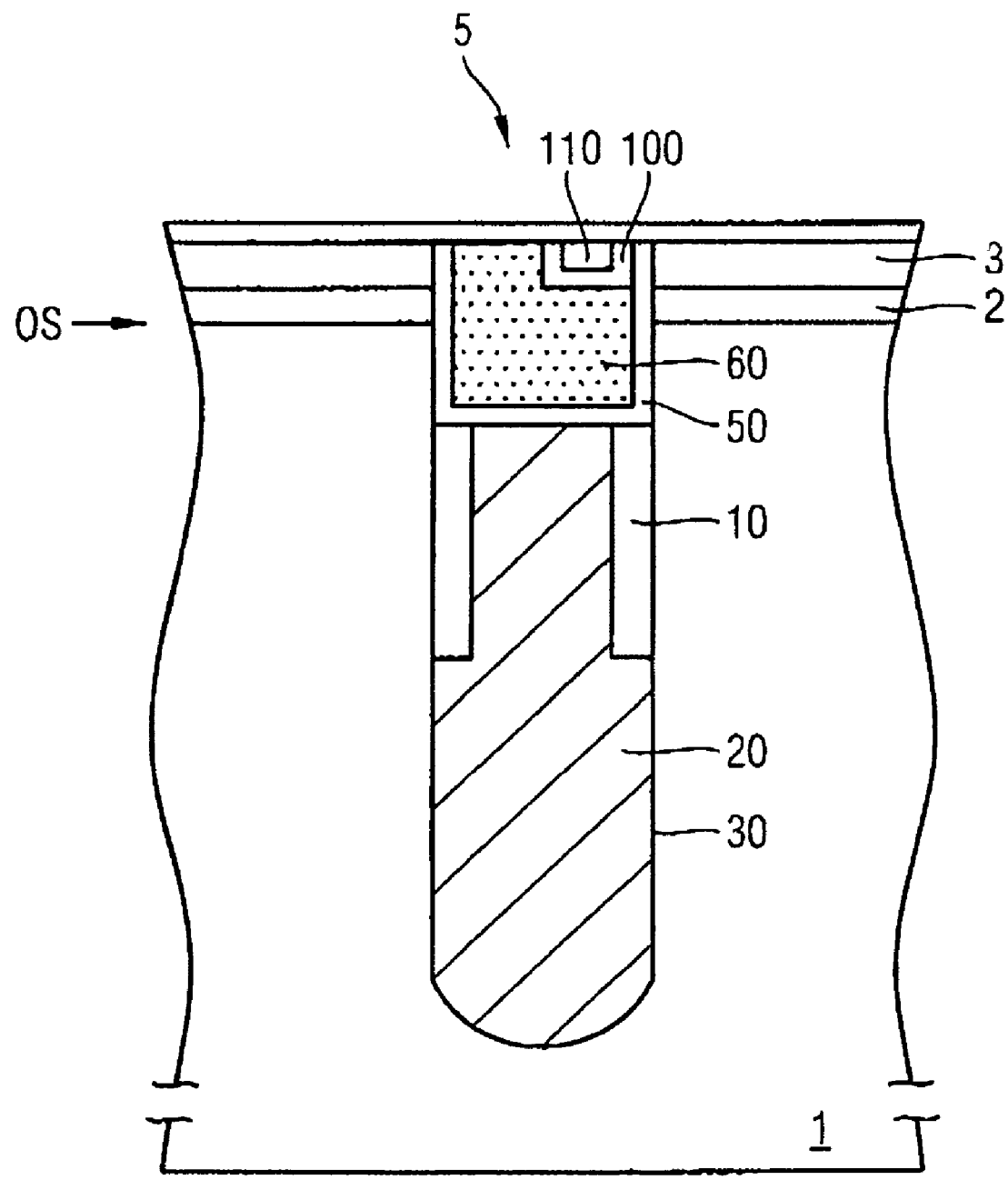

As shown in FIG. 3D, this is followed by planarizing removal down to the top side of the step of the sacrificial filling 60, for example by means of a chemical-mechanical polishing step. As a result, a subregion of the sacrificial filling 60 is removed. Consequently, a subregion of the sacrificial filling 60 is uncovered, whereas a complementary subregion remains masked by the liner layer 100 and the upper mask layer 110.

Figure 3E:
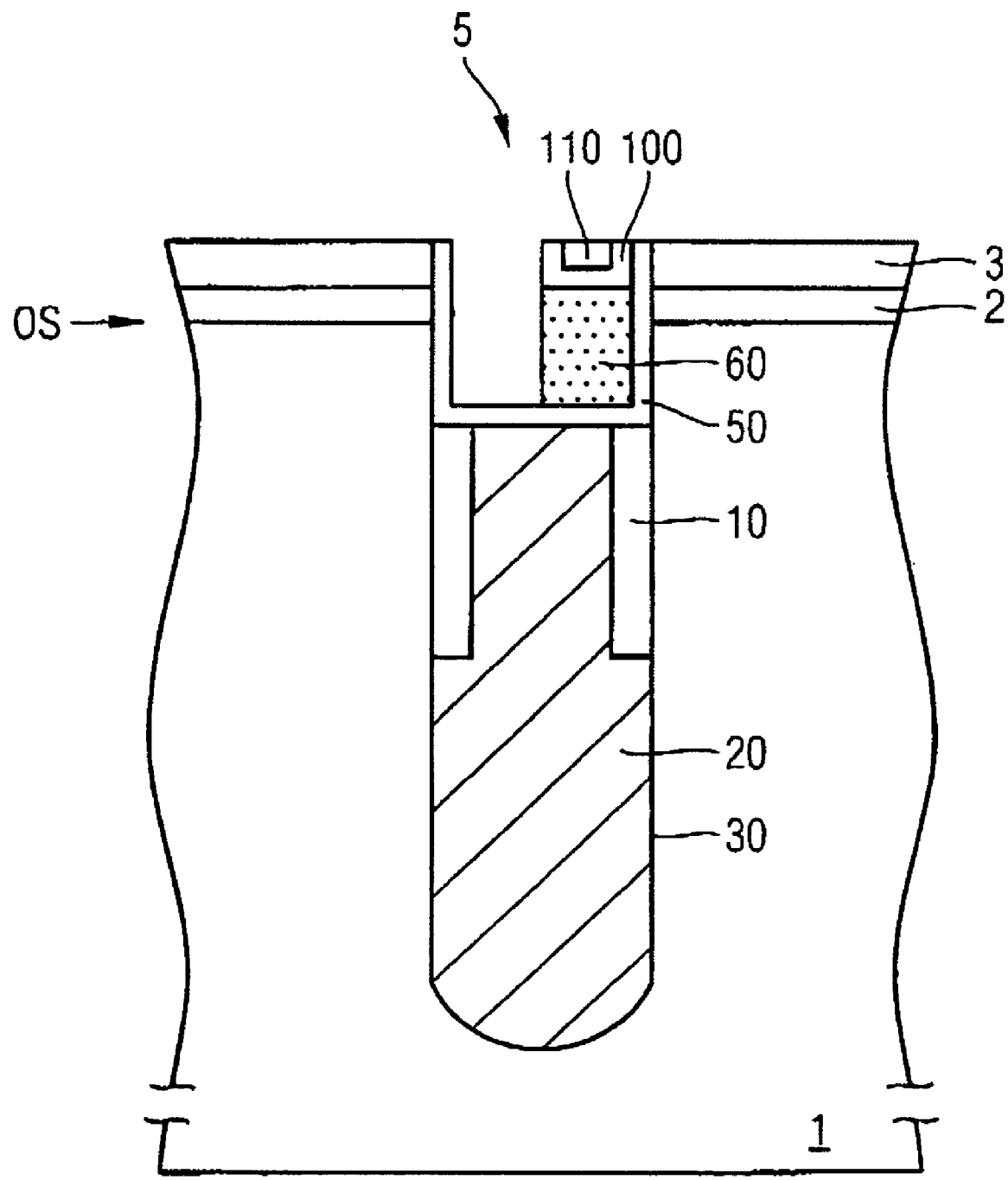

In accordance with FIG. 3E, an anisotropic etching process is then carried out, removing the unmasked subregion of the sacrificial filling 60 of amorphous silicon. As in the first embodiment above, this etching process stops at the liner mask layer 50.

Figure 3F:
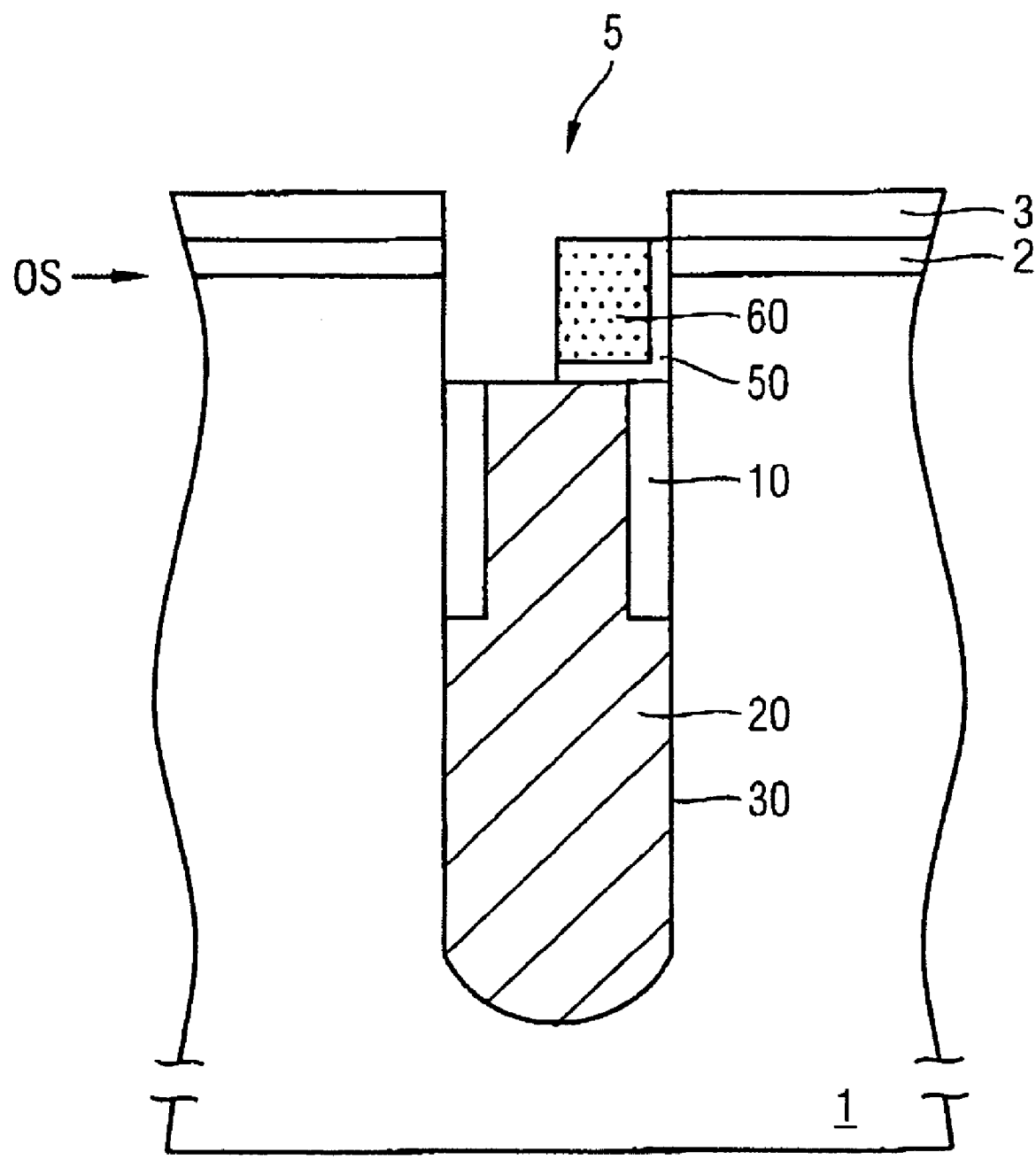

Continuing with reference to FIG. 3F, the liner mask layer 50 is then removed by an isotropic etching process where it is uncovered at the surface.

Figure 3G:
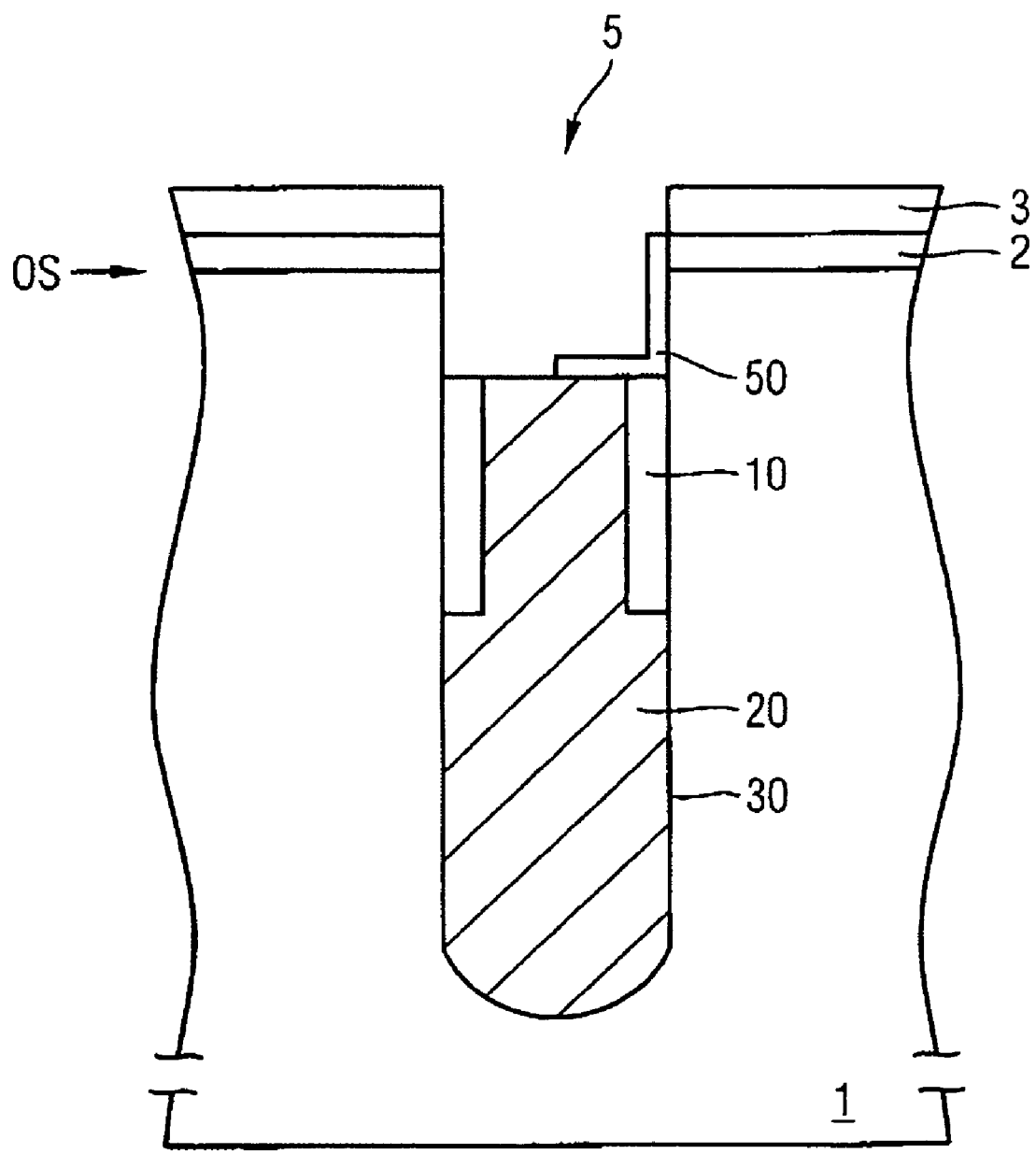

Finally, referring now to FIG. 3G, the remaining sacrificial filling 60 of amorphous silicon is removed.

Figure 4A:
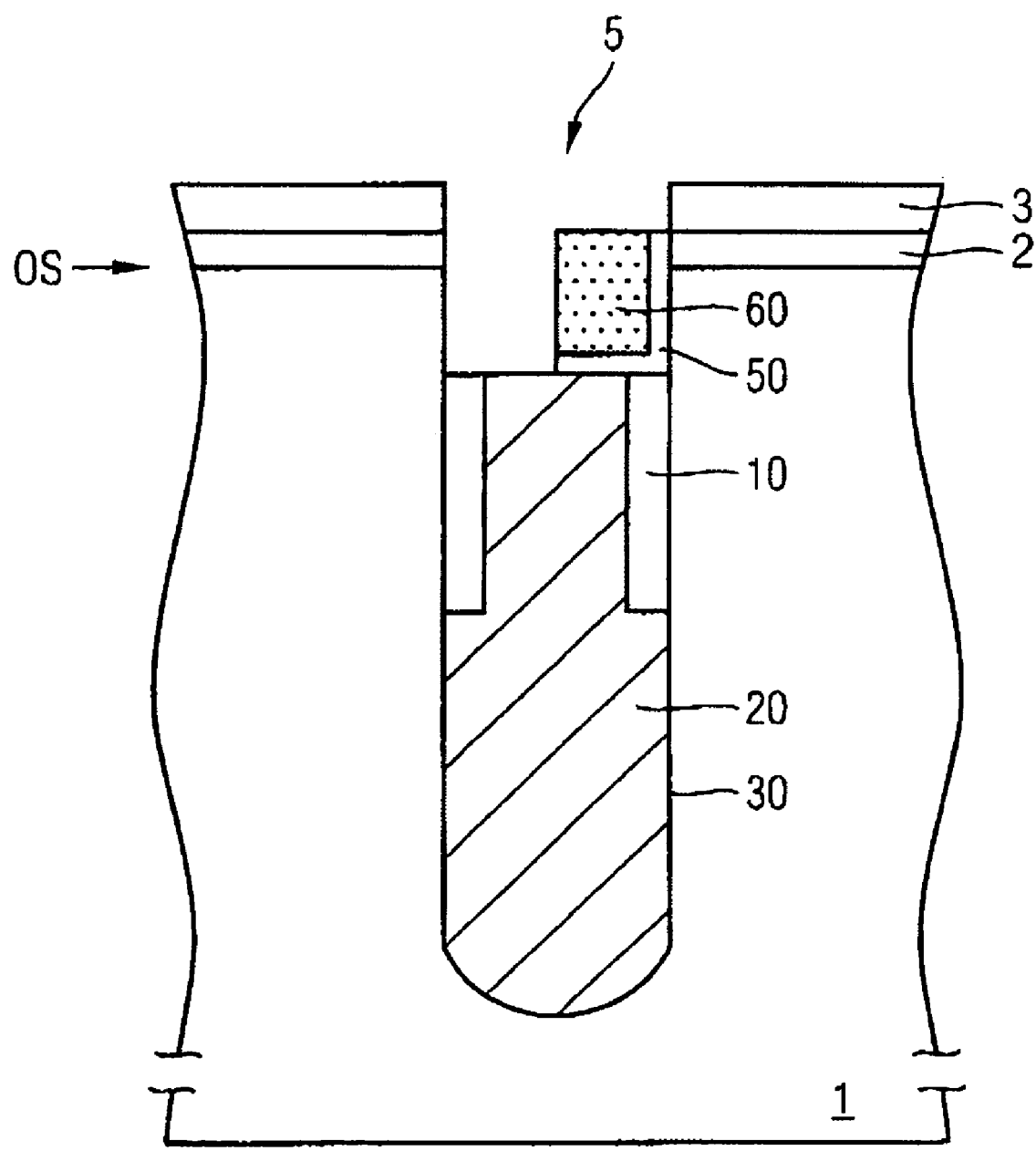
FIGS. 4A-C show successive method stages involved in a method for fabricating a shadow mask in a trench of a trench capacitor structure as a fourth embodiment of the present invention.
Figure 4B:
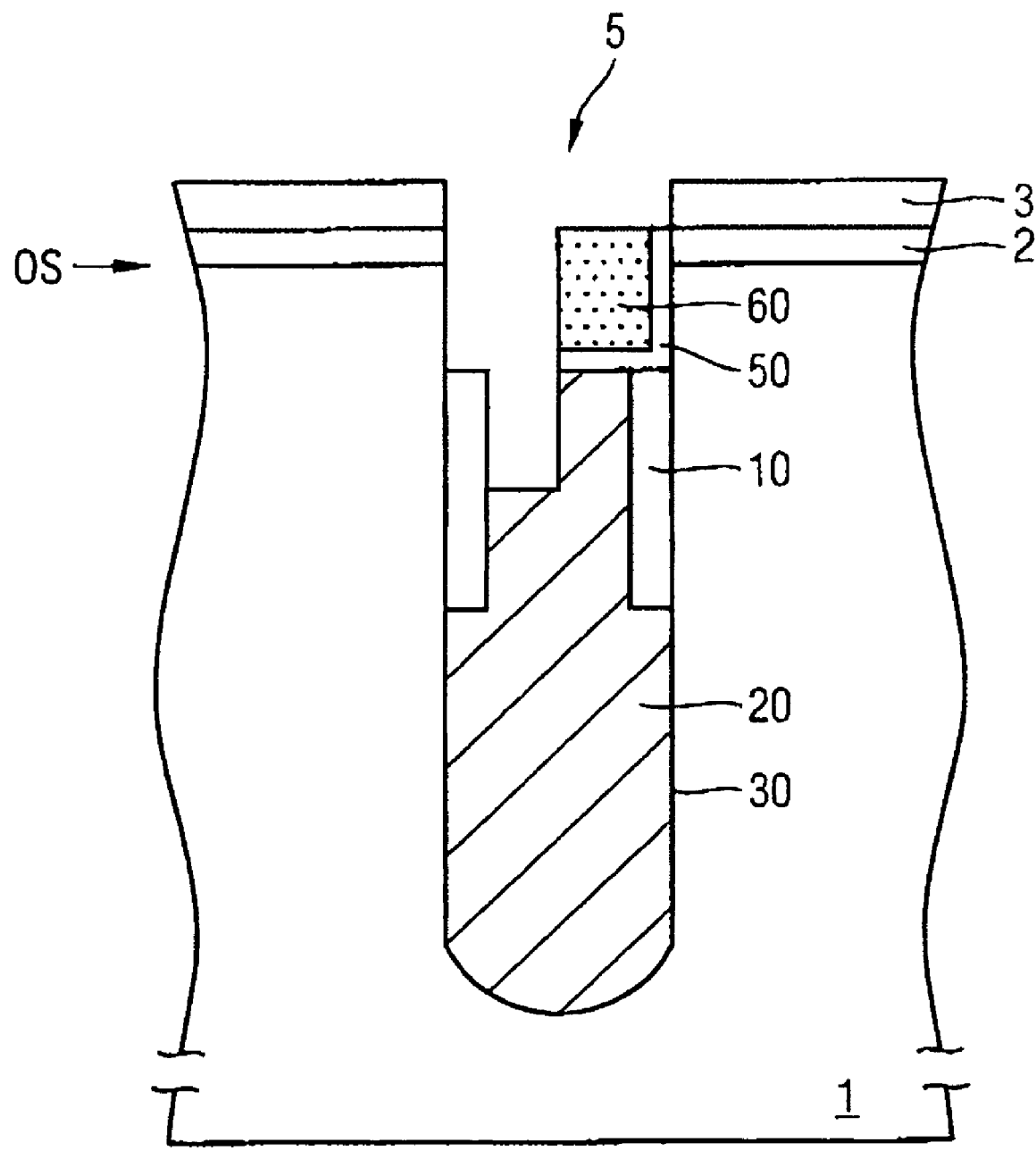
Figure 4C:
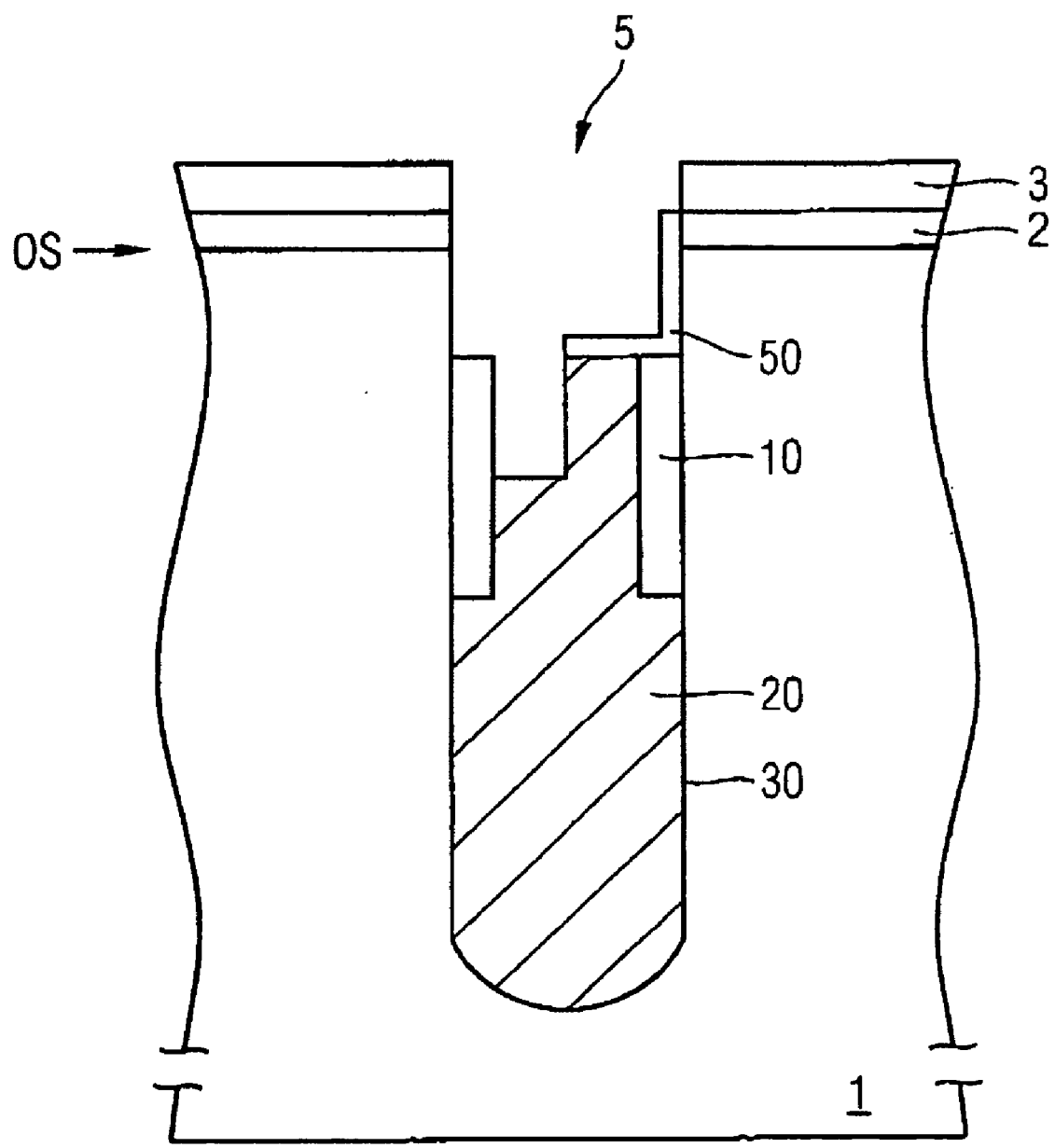

FIGS. 4A-C show successive method stages involved in a method for fabricating a shadow mask in a trench of a trench capacitor structure as a fourth embodiment of the present invention.

In the fourth embodiment, the starting state shown in FIG. 4A is equivalent to the state shown in FIG. 3F. In this fourth embodiment, the polysilicon filling 20 is etched prior to the removal of the remaining sacrificial layer filling 60.

The final state shown in FIG. 4C then corresponds, after removal of the sacrificial layer filling 60, to the state shown in FIG. 3H.

Although the present invention has been described above on the basis of a preferred exemplary embodiment, it is not restricted to this particular embodiment, but rather can be modified in numerous ways.

In particular, the choice of layer materials is only an example and can be varied in numerous ways.

| List of designations | | |
|---|---|---|
| 1 | | Si semiconductor substrate |
| OS | | Top side |
| 2 | | Pad oxide |
| 3 | | Pad nitride |
| 5 | | Trench |
| 10 | | Insulation collar |
| 20 | | Conductive polysilicon filling |
| 30 | | Capacitor dielectric |
| 50 | | Liner mask layer formed from silicon nitride |
| 60 | | Sacrificial filling formed from polysilicon |
| 70 | | Liner mask layer formed from silicon oxide |
| I, I' | | Implantation |
| 100 | | Liner mask layer formed from silicon nitride |
| 110 | | Liner mask layer formed from silicon oxide |

What is claimed is:

1. A method for fabricating a shadow mask in a trench of a microelectronic or micromechanical structure, comprising:
   providing a trench in the microelectronic or micromechanical structure;
   providing a partial filling in the trench;
   providing a first liner mask layer on the partial filling;
   providing a sacrificial filling on the liner mask layer to completely fill the trench;
   shallow etching back of the sacrificial filling into the trench;
   forming a first mask on a top side of the sacrificial filling in the trench by a shadow mask process;
   removing a subregion of the sacrificial filling in the trench using the first mask; and
   optionally removing a subregion of the first liner mask layer below it on the partial filling, a remaining subregion of the sacrificial filling in the trench serving as a second mask, wherein the first mask is formed by:
   carrying out an oblique implantation to modify the etching rate of a subregion at the top side of the sacrificial filling in the trench for a predetermined etching process;
   selectively recessing the subregion or the complementary subregion at the top side of the sacrificial filling in the predetermined etching process;
   filling the selectively recessed subregion or complementary subregion with at least a third liner mask layer; and
   leveling the filled subregion or complementary subregion so as to be flush with the top side of the sacrificial filling.

2. The method according to claim 1, wherein the remaining subregion of the sacrificial filling is removed after removal of the subregion of the first liner mask layer.

3. The method according to claim 1, wherein the first mask is formed by:
   providing a second liner mask layer on a top side of the sacrificial filling in the trench;
   carrying out an oblique implantation to modify the etching rate of a subregion of the second liner mask layer at the top side of the sacrificial filling in the trench for a predetermined etching process; and
   selectively removing the subregion or complementary subregion of the second liner mask layer at the top side of the sacrificial filling in the predetermined etching process.

4. The method according to claim 1, wherein the microelectronic or micromechanical structure has a semiconductor substrate and a third mask, which leaves the trench uncovered.

5. The method according to claim 4, wherein the shallow etchback of the sacrificial filling into the trench is carried out down to a depth above a top side of the semiconductor substrate.

6. The method according to claim 1, wherein a capacitor dielectric is provided in a lower and middle trench regions, an insulation collar is provided in the middle and upper trench regions, and an electrically conductive filling is provided as far as the top side of the insulation collar in the trench.

7. The method according to claim 1, wherein the sacrificial filling is produced from silicon.

8. The method according to claim 1, wherein the shallow etchback of the sacrificial filling into the trench is carried out down to a depth which approximately corresponds to the trench width.

9. Use of a shadow mask produced as claimed in claim 6, for partially removing the electrically conductive filling as far as the top side of the insulation collar.

* * * * *